United States Patent
Rothacher

[11] Patent Number: 5,916,301
[45] Date of Patent: Jun. 29, 1999

[54] SAMPLE RATE CONVERSION FOR SYNCHRONOUS VARIABLE RATE

[75] Inventor: Fritz M. Rothacher, Newport Beach, Calif.

[73] Assignee: Conexant Systems, Inc., Newport Beach, Calif.

[21] Appl. No.: 08/838,899

[22] Filed: Apr. 11, 1997

Related U.S. Application Data

[63] Continuation-in-part of application No. 08/724,168, Sep. 30, 1996.

[51] Int. Cl.$^6$ .............................. G06F 17/17; G06F 17/10
[52] U.S. Cl. ............................................. 708/312; 708/300
[58] Field of Search ............................... 341/61; 395/709; 708/312; 713/501; 712/229, 37; 710/69

[56] References Cited

U.S. PATENT DOCUMENTS

| | | | |
|---|---|---|---|
| 4,725,972 | 2/1988 | Gockler | 364/724 |
| 5,245,667 | 9/1993 | Lew | 364/724.1 |
| 5,387,910 | 2/1995 | Medan et al. | 341/61 |
| 5,457,456 | 10/1995 | Norworthy | 341/61 |
| 5,731,770 | 3/1998 | Minoda | 341/61 |

*Primary Examiner*—Hassan Kizou
*Assistant Examiner*—Nguyen Xuan Nguyen
*Attorney, Agent, or Firm*—Philip K. Yu

[57] ABSTRACT

The concept of integer ratio sample rate conversion is extended to fractional values, where the exact ratio is expressed as [M+N/D]/L with L being a constant. This methodology allows sample rate conversion for all synchronous rates, where all rates are derived from the same crystal oscillator. For the implementation, the value of N/D is accumulated and depending on the overflow condition, either M or M+1 is selected as sample rate ratio for the conversion of each sample.

3 Claims, 2 Drawing Sheets

SAMPLE RATE CONVERSION FOR SYNCHRONOUS VARIABLE RATE

CROSS-REFERENCE TO RELATED APPLICATIONS

The present application is a continuation-in-part of application Ser. No. 08/724,168, filed on Sep. 30, 1996, entitled DISTRIBUTED DECIMATION SAMPLE RATE CONVERSION, the disclosure of which is incorporated herein by reference.

FIELD OF THE INVENTION

The present invention is related to electronics circuits for converting data samples at one sample rate into data samples at another sample rate. More particularly, the invention is related to sample rate converters for high quality audio signal processing and conversion.

ART BACKGROUND

With the progress in digital processing and communication technology, it is becoming quite common to digitize signals produced by analog sources for further processing in the digital domain, for storage in digital form, or for transmission through digital media. However, in the digital domain, there are different sampling rates used depending on the required quality and the available bandwidth. Thus, it has become important to have simple digital interfacing between different equipment and media.

The concept of digital sample rate conversion ("SRC") is well known to those who work with digital signals for multimedia applications. A conventional approach to the application of SRC is to first digitize some analog signals at a constant sample rate using an analog-to-digital converter ("ADC"). The digital signals are then applied to the SRC so that the converted signals will have a sample rate suitable for the intended purposes and applications. The SRC may have the following applications, as an example:

In order to transmit high-quality ("HQ") audio signals through a communications channel, e.g. phone line, with bandwidth 4 kHz, it is required to down-convert the s source signals' sample rate to 8 kHz for the transmission, since the HQ signals have typically been sampled at a sample rate of 44.1 kHz or 48 kHz.

Further, to digitally store the digitized speech signals on a PC for later processing, SRC is also needed, due to the difference in sample rates. Also, to digitally mix signals from CD-ROM with speech annotation, it is necessary to convert their sample rates to the same sample rate for the mixing, since the CD-ROM has a sample rate of 44.1 kHz, while speech typically has a sample rate of 8 kHz. While it is possible to convert both signals into analog for mixing in the analog domain, it has been quite expensive in the analog domain due to the need for DAC and ADC, not to mention the attendant distortion problems. Therefore, a digital SRC is needed to convert all source signals to a common sample rate, e.g. 44.1 or 48.0 kHz.

FIG. 1 illustrates a conventional application of SRC for HQ audio signals. Such a system may include a mixer or microphone 110 for receiving analog source signals 100 such as music or speech, the received signals are then converted into an oversampled digital form by a sigma-delta analog/digital converter (ADC) 120. The digital signals are then applied a decimation filter 130 for converting its sample rate to, e.g. 44.1 kHz, before they are applied to the SRC 140 to down convert its sample rate to a range between 4 and 44.1 kHz. The resulting signals 145 can then be transmitted through a telephone link 150, stored in a permanent memory, or storage disk 155 or mixed with other source signals 160.

But the conventional system is quite costly both in memory and computation cycle requirements in order to be able to convert from 44.1 down to 4 or 8 kHz, since this is a down conversion factor of more than 11 and 5, respectively. Since the required resources for the SRC both in memory and computations are proportional to the down sample ratio of the SRC, it is thus desirable to have a much more efficient implementation than the conventional approach. A novel implementation has been disclosed by the above-referenced parent Patent Application, entitled DISTRIBUTED

DECIMATION SAMPLE RATE CONVERSION

For playback, it has been necessary to up-convert source frequency to a constant sink frequency by the SRC 141 as shown in FIG. 1(b). The source signal may be digital signals from a modem or a storage unit. The sink signal can subsequently be processed for effect-processing or mixing, before it is output to a DAC 142 and speaker 143.

Conventionally, the SRC in both the record and playback cases is implemented, e.g. in a DSP, with a converter ratio of M/L, where M and L are both programmable. For an efficient hardware implementation, L is typically chosen to be a constant, e.g. power of 2, therefore limiting the possible sample rates or requiring a phase lock loop ("PLL"). The conventional approaches to sample rate conversion for a programmable ratio M/L can be found in an IEEE article, entitled INTERPOLATION AND DECIMATION OF DIGITAL SIGNALS—A TUTORIAL REVIEW, by Crochiere, Ronald E. and Lawrence R. Rabiner, Proceedings of IEEE, pages 300–331, 1981. The same authors also disclosed the conventional approach in their book, entitled MULTIRATE DIGITAL SIGNAL PROCESSING, Prentice Hall, Englewood Cliffs, N.J. 07632, 1983. Their book presents the underlying concept from signal processing point of view, but not the hardware implementation aspects. The above disclosures by Crochiere and Rabiner are hereby incorporated by reference as well.

The most basic method of converting samples from a source rate (Fsource) to a sink rate (Fsink) is using a first-in first-out memory (FIFO) and dropping or repeating samples in case of overflow or underflow. A considerably better quality can result if the output samples are linearly interpolated at the desired sink sample rate. To reach CD quality, an even more complicated method is required using polyphase FIR filters for the interpolation. The works by the above mentioned Crochiere and Rabiner provided the conventional techniques for HQ SRC by integer ratios M/L, which can be reasonably carried out by a digital signal processor. For example, from 44.1 kHz to 48.0 kHz, M=147 and L=160. However, for a dedicated efficient hardware implementation, L is usually chose to be a power of 2, which limits the possible source sample rates in the playback case to multiples of $F_{sink}/L$.

SUMMARY OF THE INVENTION

Therefore, it is an object of the present invention to efficiently perform sample rate conversion for synchronous variable rate signals for high quality audio signals in both record and playback applications.

It is also an object of the present invention to perform multi-channel sample rate conversion for synchronous variable rate signals with increased computation power to handle multi-channel input signals.

The concept of integer ratio sample rate conversion is extended to fractional values, where the exact ratio is expressed as [M+N/D]/L with L being a constant. This methodology allows sample rate conversion for all synchronous rates, where all rates are derived from the same crystal oscillator. For the implementation, the value of N/D is accumulated and depending on the overflow condition, either M or M+1 is selected as sample rate ratio for the conversion of each sample.

BRIEF DESCRIPTION OF THE DRAWINGS

FIG. 1(a) is a simplified block diagram of a conventional sample rate for playback.

DETAILED DESCRIPTION OF THE PREFERRED EMBODIMENTS

A method and system for sample rate conversion for synchronous variable rate is disclosed. This embodiment has been developed for implementation as an integrated circuit for use with digital audio equipment. It should be understood by those skilled in the art that modifications may be made to optimize the sample rate converter for different applications and systems. The range of sample rates are factors among others which can be optimized for a given application.

Figure 1:
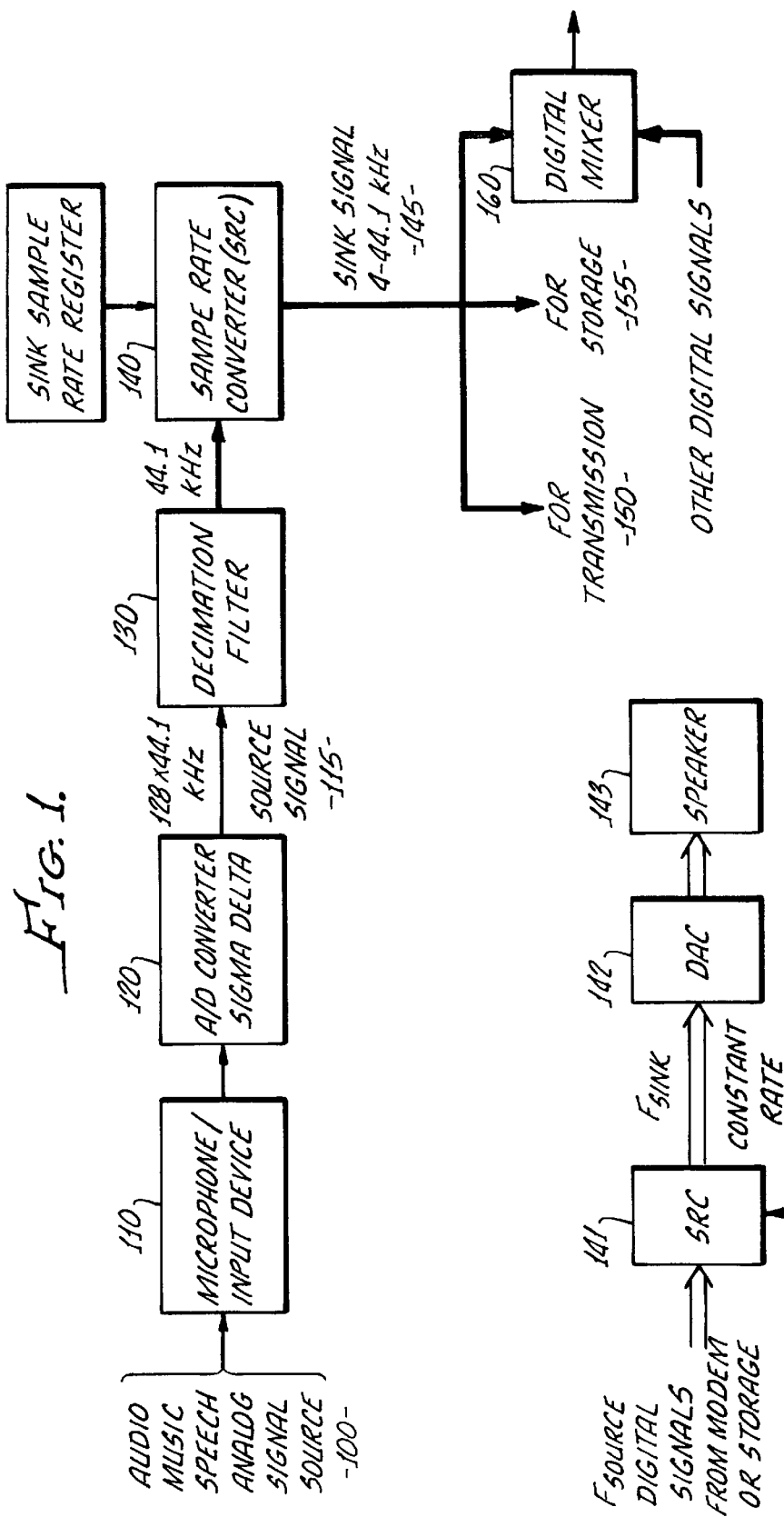
FIG. 1 is a simplified block diagram of a conventional high-quality sample rate conversion system for recording.
Figure 2:
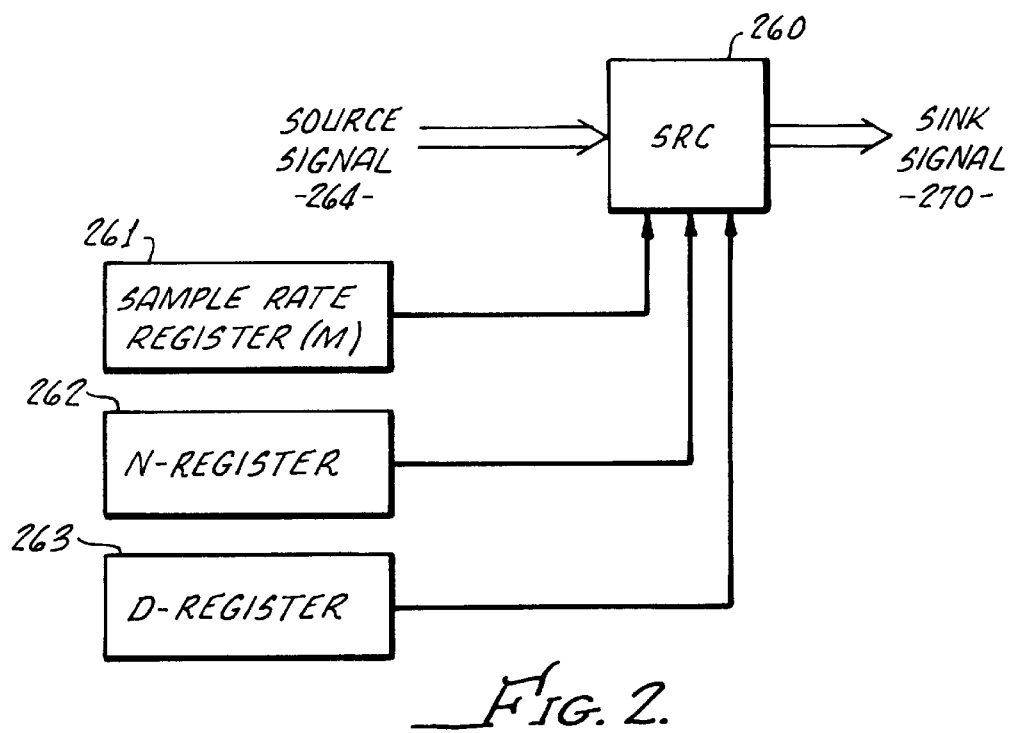
FIG. 2 is a simplified block diagram of the sample rate conversion system in accordance with the present invention for record and playback.

Reference is to FIG. 2, where a simplified block diagram of the sample rate conversion for synchronous variable rate in accordance with the present invention is shown. The system in FIG. 2 can be used for recording, as well as playback.

To prepare the source signal 264 for digital mixing or transmission in multimedia applications, it will be necessary to be able to convert the sample rate to a range between 4 kHz and 44.1 kHz, using a sample-rate converter ("SRC") 260. Note that for recording, the source signal 264 has a fixed sample rate, since the source signal comes from the ADC ("analog-to-digital converter"). For playback, the sink signal 270 has a fixed sample rate, since the sink signal will be applied to the DAC ("digital-to-analog converter") for processing.

Three control registers are used to define the programmable sink rate as $(M+N/D)/L \times F_{source}$, where L is constant and has a value in power of 2. The three control registers are shown as M-register 261, N-register 262 and D-register 263 in FIG. 2. For all source sample rates and sink sample rates derived from the same reference frequency, e.g. from the same crystal oscillator, the values of M, N and D can be determined to fulfill the above equation.

Figure 3:
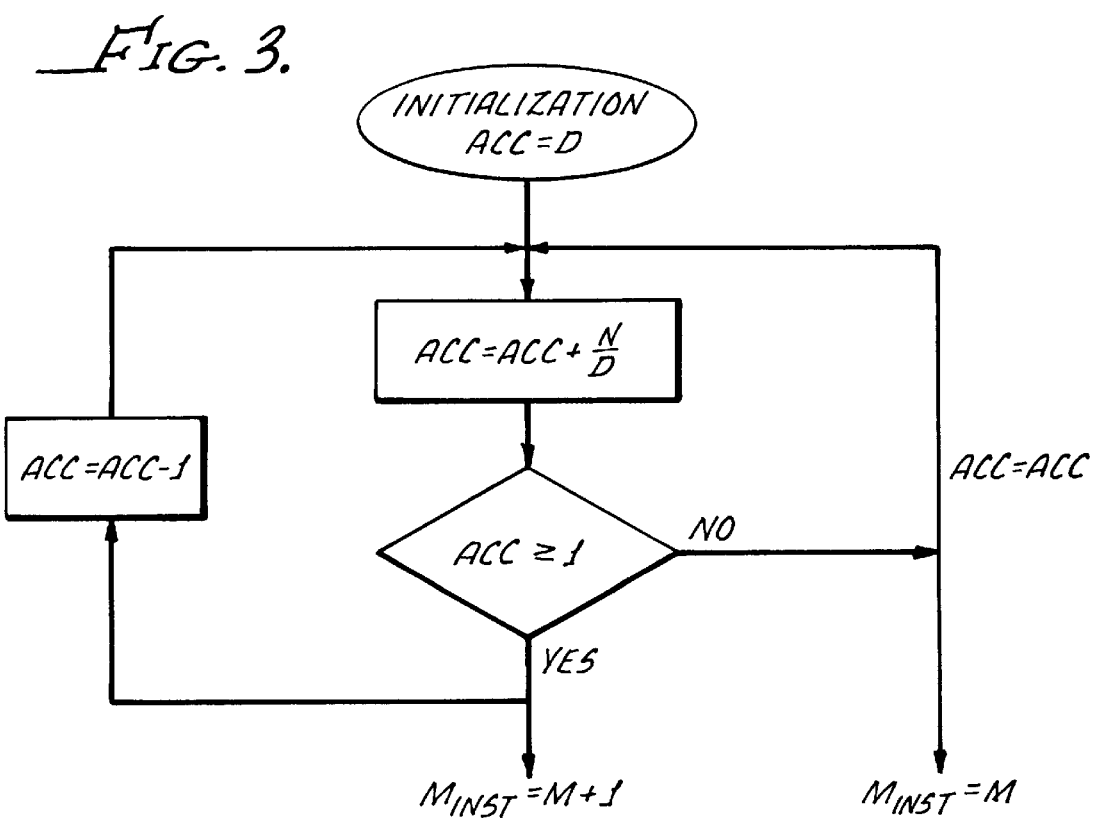
FIG. 3 is a simplified flow chart for the methodology in accordance with the present invention.

Reference is to FIG. 3, where a flow chart of the algorithm for determining the instantaneous M ("$M_{inst}$") is disclosed.

For each sink sample, the ratio of N/D is accumulated in the accumulator (Step 300). If the accumulated value is greater than or equal to 1, then $M_{inst}$=M+1 (Step 310) and the accumulator is decremented by 1 (Step 320) for the initial value of the accumulator in the next sample.

If the accumulated value in Step 310 is less than 1, then $M_{inst}$=M.

This process will repeat for each sample, such that the average of $M_{inst}$ for all samples will equal to (M+N/D). As can be appreciated by those skilled in the art, the advantage in this methodology is that it is now implemented in hardware. Also, the implementation does away with a phase-locked loop ("PLL"). This in turns translates into capability in performing multi-channel SRC for multimedia applications.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

I claim:

1. A method of converting sample, from a first signal with a first sample rate to a second signal with a second sample rate, for synchronous variable rates, wherein the first and second sample rates are divisible by an integer from a predetermined frequency, comprising the steps of:

a) determining a ratio of the first sample rate to the second sample rate;

b) expressing the ratio as (M+N/D)/L, where:
   L=a predetermined constant,
   N and D are integers,
   M is an integer portion of the ratio;

c) for each sample, accumulating N/D;

d) for each sample, setting (M+N/D)/L as either one of M/L or (M+1)/L, where:
   M+1 is chosen, if the accumulated N/D$\geq$1,
   M is chosen, if the accumulated N/D<1;

e) for each sample, calculating a sample at the second sample rate from the samples at the first rate, using either one ratio of M/L or (M+1)/L.

2. The method according to claim 1, wherein L has a value of power of 2.

3. The method according to claim 2, wherein L is equal to 2 to the power of 16.

* * * * *